(12) United States Patent
Cai et al.

(10) Patent No.: US 9,258,894 B2
(45) Date of Patent: Feb. 9, 2016

(54) BOLOMETER AND PREPARATION METHOD THEREOF

(75) Inventors: Jian Cai, Beijing (CN); Qian Wang, Beijing (CN); Ziyu Liu, Beijing (CN); Yang Hu, Beijing (CN)

(73) Assignee: Tsinghua University, Beijing (CN)

( * ) Notice: Subject to any disclaimer, the term of this patent is extended or adjusted under 35 U.S.C. 154(b) by 0 days.

(21) Appl. No.: 14/353,020

(22) PCT Filed: Jul. 25, 2012

(86) PCT No.: PCT/CN2012/079126
§ 371 (c)(1),
(2), (4) Date: Aug. 19, 2014

(87) PCT Pub. No.: WO2013/056582
PCT Pub. Date: Apr. 25, 2013

(65) Prior Publication Data
US 2015/0021479 A1  Jan. 22, 2015

(30) Foreign Application Priority Data
Oct. 19, 2011 (CN) .......................... 2011 1 0319208

(51) Int. Cl.
*G01J 5/20* (2006.01)
*H01L 27/14* (2006.01)
(Continued)

(52) U.S. Cl.
CPC . *H05K 1/115* (2013.01); *G01J 5/00* (2013.01); *G01J 5/02* (2013.01); *G01J 5/10* (2013.01);
(Continued)

(58) Field of Classification Search
CPC ...................................... G01J 5/02; G01J 5/00
USPC ................................ 250/338.1, 338.2, 338.4
See application file for complete search history.

(56) References Cited

U.S. PATENT DOCUMENTS 5,646,067 A * 7/1997 Gaul .............................. 438/458
6,388,256 B1 * 5/2002 Watton et al. .............. 250/338.4
(Continued)

FOREIGN PATENT DOCUMENTS

CN  101038210 A  9/2007
CN  101101918 A  1/2008
(Continued)

OTHER PUBLICATIONS

PCT International Search Report for PCT Counterpart Application No. PCT/CN2012/079126 with full English translation, 8 pgs. (Nov. 1, 2012).

*Primary Examiner* — David Porta
*Assistant Examiner* — Meenakshi Sahu
(74) *Attorney, Agent, or Firm* — Blakely, Sokoloff, Taylor & Zafman LLP

(57) ABSTRACT

A bolometer and a preparation method thereof. The bolometer includes: an infrared detection element (1) and a readout circuit (2), wherein the infrared detection element (1) is formed on one side of a first substrate (100), and an edge of the infrared detection element (1) is provided with an electrode hole (9), and the readout circuit (2) is formed on one side of a second substrate (200) and the readout circuit (2) has an electrode, the first substrate (100) is formed thereon with a silicon via (8) passing through the first substrate (100) and filed with a conductive material, the electrode hole (9) of the infrared detection element (1) is electrically connected to the electrode of the readout circuit (2) via the conductive material filled in the silicon via (8). The following defects are overcome: bolometers in the prior art need to flatten the silicon wafer surface with a suitable chemical-mechanical polishing process after a readout circuit thereof has been manufactured, the circuit is large in area, and the requirements of the system integration process are high.

10 Claims, 6 Drawing Sheets

(51) Int. Cl.
    *H01L 31/00*     (2006.01)
    *H05K 1/11*      (2006.01)
    *G01J 5/02*      (2006.01)
    *G01J 5/00*      (2006.01)
    *H01L 27/144*    (2006.01)
    *H01L 31/02*     (2006.01)
    *G01J 5/10*      (2006.01)
    *G01J 5/24*      (2006.01)
    *H01L 27/146*    (2006.01)
    *H01L 21/683*    (2006.01)
    *H01L 23/48*     (2006.01)

(52) U.S. Cl.
    CPC .... *G01J 5/20* (2013.01); *G01J 5/24* (2013.01); *H01L 21/6835* (2013.01); *H01L 27/1443* (2013.01); *H01L 27/14683* (2013.01); *H01L 31/02005* (2013.01); *H01L 23/481* (2013.01); *H01L 2221/6834* (2013.01); *H01L 2221/68327* (2013.01); *H01L 2221/68354* (2013.01); *H01L 2224/11002* (2013.01); *H05K 2201/032* (2013.01); *H05K 2201/0329* (2013.01)

(56) References Cited

U.S. PATENT DOCUMENTS

| | | | |
|---|---|---|---|
| 7,718,965 B1 * | 5/2010 | Syllaios et al. | 250/338.1 |
| 2010/0130007 A1 * | 5/2010 | Wang et al. | 438/666 |
| 2010/0245647 A1 * | 9/2010 | Honda et al. | 348/308 |
| 2012/0092390 A1 * | 4/2012 | Ludwig et al. | 345/690 |

FOREIGN PATENT DOCUMENTS

| | | | |
|---|---|---|---|
| CN | 101713688 A | 5/2010 |
| CN | 101927976 A | 12/2010 |
| CN | 102214662 A | 10/2011 |
| JP | 2007-171170 A | 7/2007 |
| JP | 2007171170 A | 7/2007 |
| JP | 5343729 B2 | 11/2013 |

\* cited by examiner

BOLOMETER AND PREPARATION METHOD THEREOF

FIELD OF THE INVENTION

The present invention relates to the field of thermal radiation measurement, particularly to a bolometer and preparation method thereof.

BACKGROUND OF THE INVENTION

Bolometer is a device sensitive to thermal radiation and can convert invisible radiation into visible or measurable signals. By refrigerating method, bolometers may be classified into refrigerating bolometers and non-refrigerating bolometers. As non-refrigerating bolometers have such advantages as working at room temperature, no need of refrigeration, spectral response independent of wavelength, a relatively simple preparation process, low cost, small volume, easy use and maintenance and high reliability and/or the like, they have become a very promising development direction of bolometers.

Currently, the most popular non-refrigerating bolometer is vanadium oxide microbridge bolometer. It realizes thermal detection by a vanadium oxide thermosensitive film with a high temperature coefficient of resistance (TCR) on the surface of the microbridge. The preparation process of this type of bolometer includes four parts (refer to FIG. 1): (1) preparing a readout integrated circuit (ROIC) of an thermal radiation detector on a silicon wafer; (2) depositing a thin-film sacrificial layer and lithography and etching; (3) depositing a low-stress silicon nitride supporting layer and a vanadium oxide film on the patterned sacrificial layer, preparing a metal layer for interconnection, and lastly depositing a very thin silicon nitride protective layer on the surface of the film; (4) etching the sacrificial layer on the silicon wafer and releasing the microbridge of the thermal radiation detector.

In the process flow shown in FIG. 1, after the ROIC is prepared, an appropriate chemical-mechanical polishing (CMP) process is needed to realize flattening of silicon wafer surface to control the subsequent uniformity of surface height of the microbridge structure. Therefore, this process flow needs to use a strict ROIC flattening technique. In addition, the foregoing structure needs to reserve an enough space for the export of electrical signals on the edge of the microbridge, so it is adverse to the downsizing of the entire detection unit. Furthermore, this structure is prepared on a same substrate and has strict requirements for process integration and process control.

SUMMARY OF THE INVENTION

To address the above defects of the prior art during preparation of a bolometer, the present invention provides a bolometer which can overcome the above defects, as well as the preparation method thereof.

The present invention provides a bolometer, comprising a thermal radiation measurement element and a readout circuit, wherein the thermal radiation measurement element is formed on one side of a first substrate, an edge of the thermal radiation measurement element is provided with an electrode hole, the readout circuit is formed on one side of a second substrate and has an electrode, the first substrate is formed thereon with a silicon via passing through the first substrate and filled with a conductive material, and the electrode hole of the thermal radiation measurement element is electrically connected to the electrode of the readout circuit via the conductive material filled in the silicon via.

The present invention also provides a method for preparation of the bolometer, which includes:

Etching one side of a first substrate to form a hole and filling the hole with a conductive material;

Preparing a thermal radiation measurement element on the side of the first substrate on which the hole is formed, wherein the thermal radiation measurement element has an electrode hole which electrically contacts the hole;

Thinning the other side of the first substrate without the prepared thermal radiation measurement element until the hole is exposed in order to form a silicon via;

Metalizing the other side of the first substrate without the prepared thermal radiation measurement element;

Preparing a readout circuit on a second substrate, wherein the readout circuit has an electrode;

Bonding the metalized side of the first substrate and the side of the second substrate with the prepared readout circuit, thereby realizing electrical connection between the electrode hole of the thermal radiation measurement element and the electrode of the readout circuit via the conductive material filled in the silicon via.

In the bolometer according to the present invention, the thermal radiation measurement element and the readout circuit are interconnected via the silicon via, so it does not need a strict chemical-mechanical polishing (CMP) process after preparation of a readout circuit as otherwise needed in the prior art in order to ensure height uniformity of the surface of the silicon wafer with a readout circuit. Further, as silicon via technique is adopted, it does not need to reserve an enough space on the edge of the thermal radiation measurement element in order to export electrical signals of the thermal radiation measurement element. Therefore, the size of the bolometer can be reduced.

DETAILED DESCRIPTION OF THE EMBODIMENTS

Now the non-refrigerating bolometer according to the present invention will be descried in detail with connection with the accompanying drawings.

Figure 1:
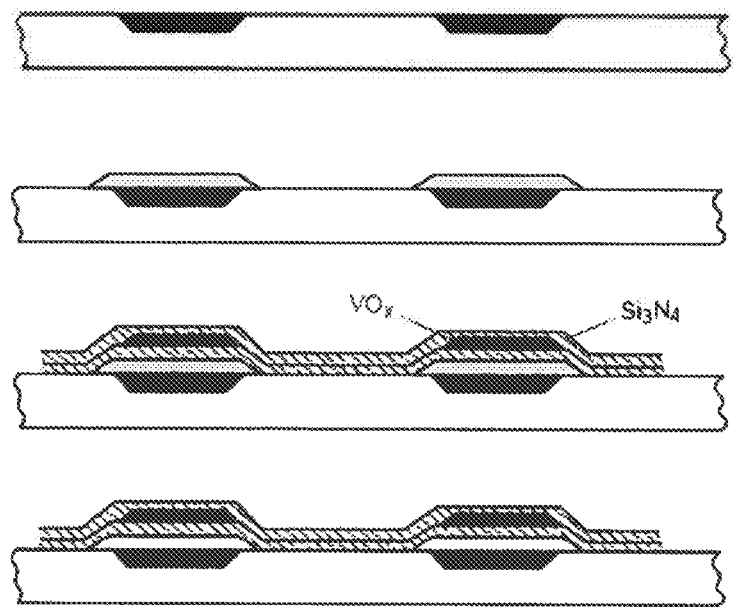
FIG. 1 shows a process flow for preparation of a bolometer in the prior art.
Figure 2:
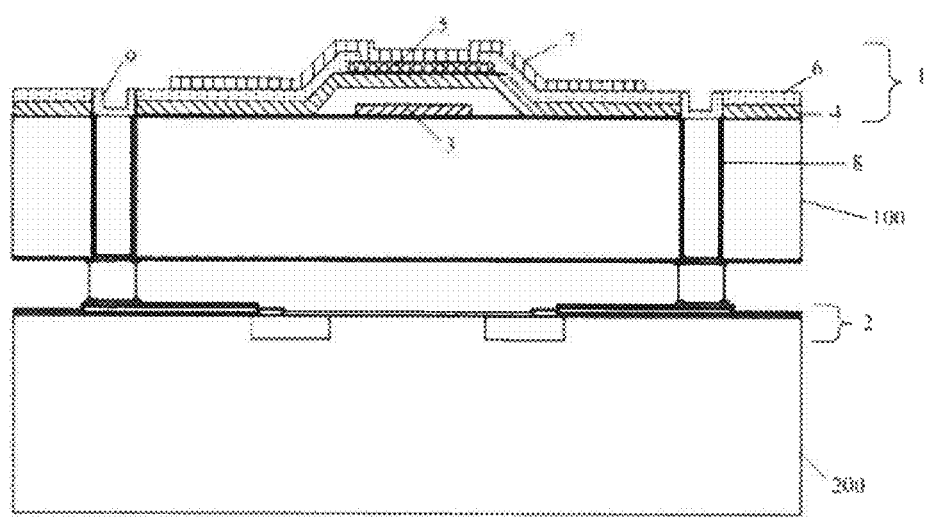
FIG. 2 is a cross section view of a bolometer provided according to the present invention.

As shown in FIG. 2, the bolometer according to the present invention includes: a thermal radiation measurement element 1 and a readout circuit 2, wherein the thermal radiation measurement element 1 is formed on one side of a first substrate 100, an edge of the thermal radiation measurement element 1 is provided with an electrode hole, the readout circuit 2 is formed on one side of a second substrate 200 and has an electrode, the first substrate 100 is formed thereon with a silicon via 8 passing through the first substrate 100 and filled with a conductive material, and the electrode hole of the thermal radiation measurement element 1 is electrically connected to the electrode of the readout circuit 2 via the conductive material filled in the silicon via 8.

As such, since the thermal radiation measurement element 1 and the readout circuit 2 of the bolometer according to the present invention are prepared on different substrates, the height of the thermal radiation measurement element 1 (for example, the height of a microbridge) is irrelevant to the surface of the readout circuit, thereby lowering the requirements for process integration and process control and the requirements for surface flattening of the readout circuit 2; further, as the thermal radiation measurement element 1 and the readout circuit 2 are interconnected via a silicon via 8, it does not need to reserve a space on the edge of the thermal radiation measurement element 1 in order to export electrical signals of the thermal radiation measurement element 1, thereby reducing the circuit area of the bolometer.

In a preferred embodiment according to the present invention, the silicon via 8 may be electrically connected to the electrode of the readout circuit 2 by using a metallic micro bump, micro pillar or pad structure. The silicon via 8 may be filled with various types of conductive materials, such as: one or more of copper, tungsten, polycrystalline silicon, conductive polymer and metal-polymer composite material, etc.

Further, the silicon via 8 is a through-hole with a large aspect ratio. According to the requirements for unit size of a bolometer, the diameter of the silicon via 8 may be in the range of 1~20 μm, and the depth of the silicon via 8 may be in the range of 20~200 μm.

FIG. 2 also shows an exemplary microbridge structure of the thermal radiation measurement element 1. It should be noted that the thermal radiation measurement element 1 in the bolometer of the present invention is not limited to the microbridge structure and may be another structure, such as a micro-cantilever structure for example. The thermal radiation measurement element 1 with the microbridge structure as shown in FIG. 2 comprises a reflecting layer 3, a supporting layer 4, a thermosensitive element layer 5, an interconnecting layer 6 and a protective layer 7. The supporting layer 4, the thermosensitive element layer 5, the interconnecting layer 6 and the protective layer 7 are stacked up in turn. A cavity is formed between the reflecting layer 3 and the supporting layer 4. The cavity constitutes a resonant cavity. On the edge of thermal radiation measurement element 1, there is also an electrode hole 9 interconnected to the silicon via 8. The interconnecting layer 6 is electrically connected to the electrode hole 9.

Figure 3:
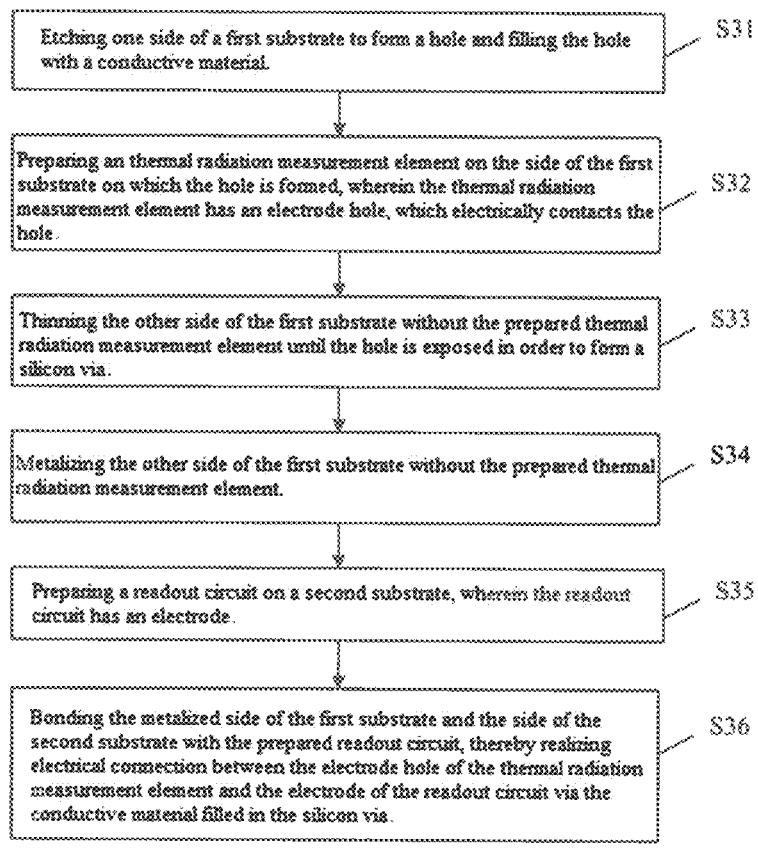
FIG. 3 is a flow chart for preparation of a bolometer provided according to the present invention; and FIG. 4

Below the preparation method of the bolometer according to the present invention is described by referring to FIG. 3. As shown in FIG. 3, the preparation method of the bolometer according to the present invention comprises:

S31: Etching one side of a first substrate to form a hole and filling the hole with a conductive material;

S32: Preparing a thermal radiation measurement element on the side of the first substrate on which the hole is formed, wherein the thermal radiation measurement element has an electrode hole which is electrically connected to the hole;

S33: Thinning the other side of the first substrate without the prepared thermal radiation measurement element until the hole is exposed in order to form a silicon via;

S34: Metalizing the other side of the first substrate without the prepared thermal radiation measurement element;

S35: Preparing a readout circuit on a second substrate, wherein the readout circuit has an electrode;

S36: Bonding the metalized side of the first substrate and the side of the second substrate with the prepared readout circuit, thereby realizing electrical connection between the electrode hole of the thermal radiation measurement element and the electrode of the readout circuit via the conductive material filled in the silicon via.

Below the detailed preparation process of the bolometer according to the present invention is described by taking a thermal radiation measurement element with a microbridge structure for example and referring to FIG. 4-FIG. 17.

Figure 4:
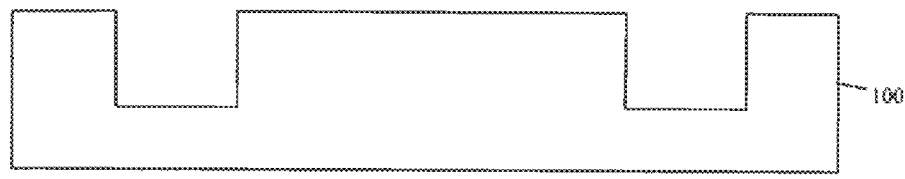

Firstly, as shown in FIG. 4, a hole is formed on a first substrate 100. The first substrate 100 may be a silicon substrate, an SOI (silicon on insulator) substrate or any other substrate well-known to those skilled in the art. This hole is a hole with a large aspect ratio. According to the requirements for unit size of a bolometer, the diameter of the hole may be in the range of 1~20 μm, and the depth of the hole may be in the range of 20~200 μm. Further, the hole may be formed by deep reactive ion etching (DUE) process or other etching processes.

Figure 5:
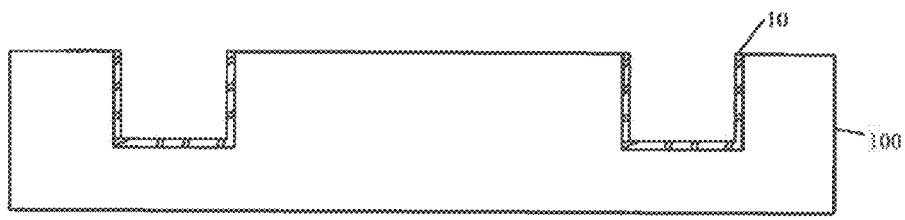

Afterwards, as shown in FIG. 5, an insulating layer 10 is formed on the bottom and side wall of the formed hole, which may be formed by thermal oxidation, or chemical vapor deposition (CVD) or other processes.

Figure 6:
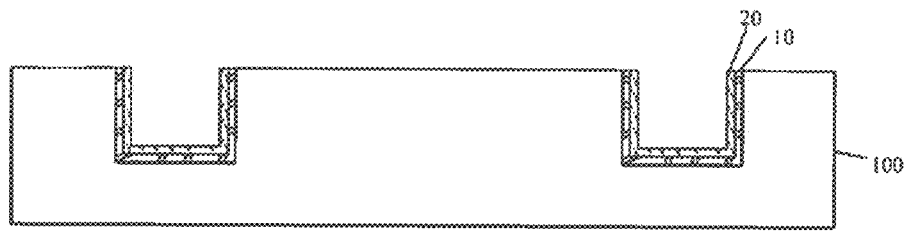

Afterwards, as shown in FIG. 6, a diffusion barrier layer 20 is formed on the bottom and side wall of the hole where the insulating layer 10 is formed, wherein the diffusion barrier layer 20 may be formed by physical vapor deposition (PVD), or CVD, or atomic layer deposition (ALD) or other processes, and the material adopted by the deposition may be Ti, Ta, TiN, TaN, etc.

Figure 7:
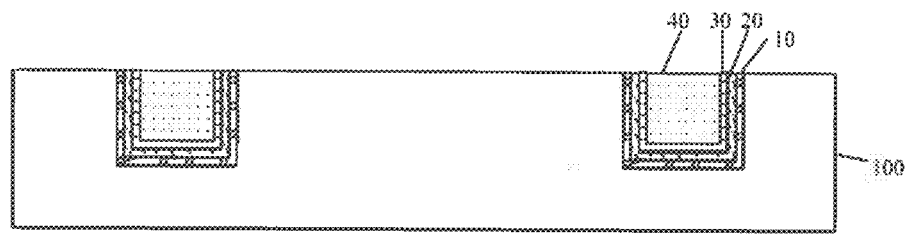

Afterwards, as shown in FIG. 7, a seed layer 30 is formed on the bottom and side wall of the hole where the diffusion barrier layer 20 is formed. Afterwards, a conductive material 40 (such as copper, tungsten, polycrystalline silicon, conductive polymer, or metal-polymer composite material) is filled into the hole. The seed layer 30 may be formed by CVD, chemical plating, electric grafting or other techniques. The conductive material 40 may be filled by electroplating, PVD, CVD or other processes.

Afterwards, the surface of the first substrate 100 filled with the conductive material 40 may be polished (for example, adopting CMP process). The flow chart as shown in FIG. 4-FIG. 7 realizes initial preparation of a silicon via.

Figure 8:
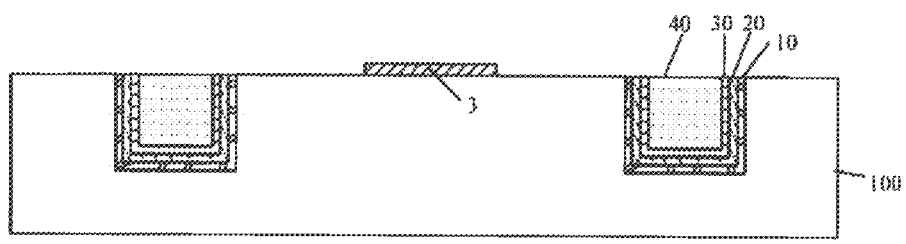

Afterwards, as shown in FIG. 8, a reflecting layer 3 is formed on the first substrate 100 and patterned. The reflecting layer 3 may be formed by lithography, CVD, PVD or other processes. The reflecting layer 3 may be made from a metal material such as NiCr alloy or Au, etc. The role of the reflecting layer 3 is to enhance the bolometer's capability of thermal absorption, thereby increasing the responsivity of the bolometer.

Figure 9:
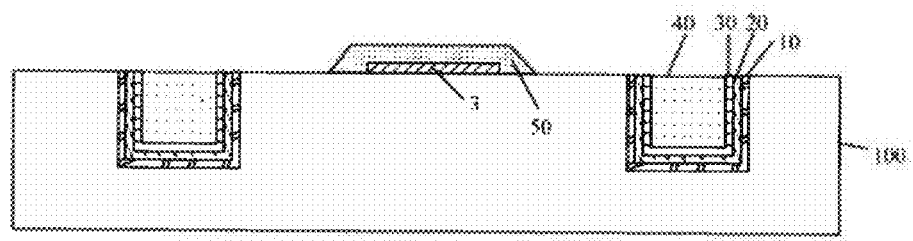

Afterwards, as shown in FIG. 9, a sacrificial layer 50 is formed on the reflecting layer 3 and patterned, wherein the sacrificial layer 50 may be made from an amorphous silicon material and may be formed by plasma enhanced CVD or PVD or other processes.

Figure 10:
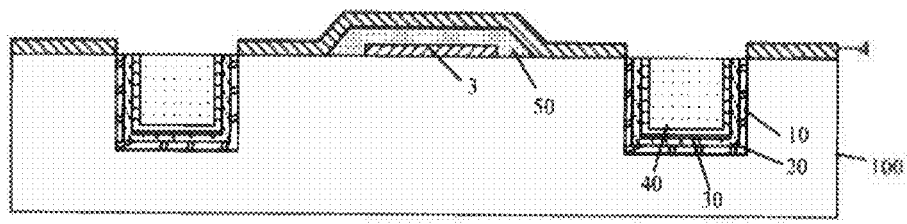

Afterwards, as shown in FIG. 10, a supporting layer 4 is formed on the sacrificial layer 50. The material of the supporting layer 4 may be silicon nitride or other materials. Further, the supporting layer 4 may be formed by CVD, PVD or other processes.

Figure 11:
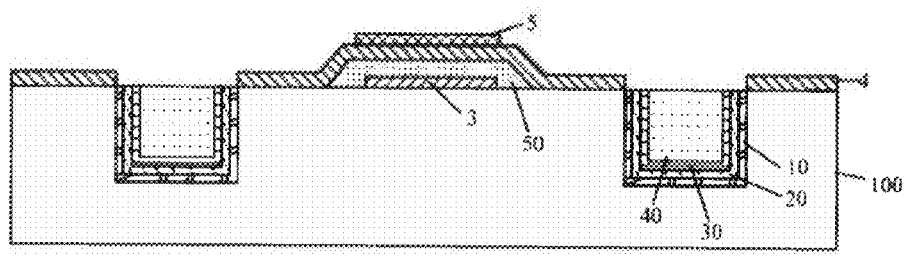

Afterwards, as shown in FIG. 11, a thermosensitive element layer 5 is formed on the supporting layer 4 and patterned, wherein the thermosensitive element layer 5 may be formed by CVD, PVD or other processes. The material of the thermosensitive element layer 5 may be a thin-film material with a high temperature coefficient of resistance (TCR) (such as vanadium oxide).

Figure 12:
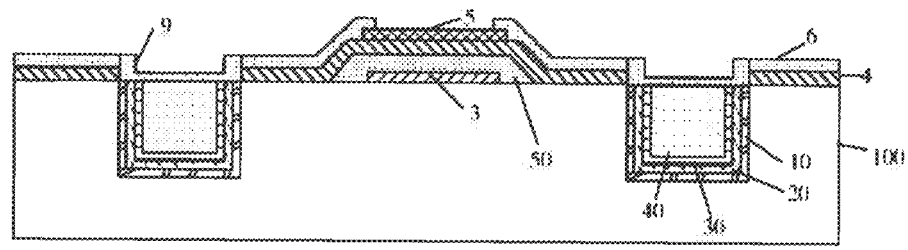

Afterwards, as shown in FIG. 12, an interconnecting layer 6 is formed on the thermosensitive element layer 5 and patterned. The interconnecting layer 6 is provided with the electrode hole 9 for electrically connecting to the formed silicon via, and may be formed by CVD, PVD or other processes.

Figure 13:
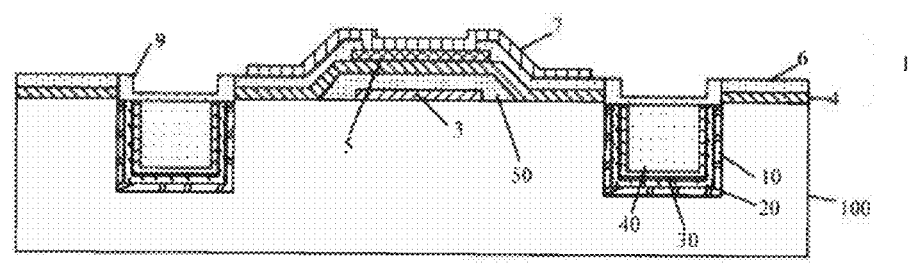

Afterwards, as shown in FIG. 13, a protective layer 7 is formed on the thermosensitive element layer 5 and the interconnecting layer 6 and patterned, wherein the protective layer 7 may be formed by CVD, PVD or other processes.

By now, through FIG. 8-FIG. 13, the thermal radiation measurement element 1 with a microbridge structure is formed. FIG. 13 illustrates the thermal radiation measurement element 1 comprises the reflecting layer 3, the supporting layer 4, the thermosensitive element layer 5, the interconnecting layer 6 and the protective layer 7, wherein the sacrificial layer 50 will be removed in the subsequent process flow to form a resonant cavity between the reflecting layer 3 and the supporting layer 4.

Figure 14:
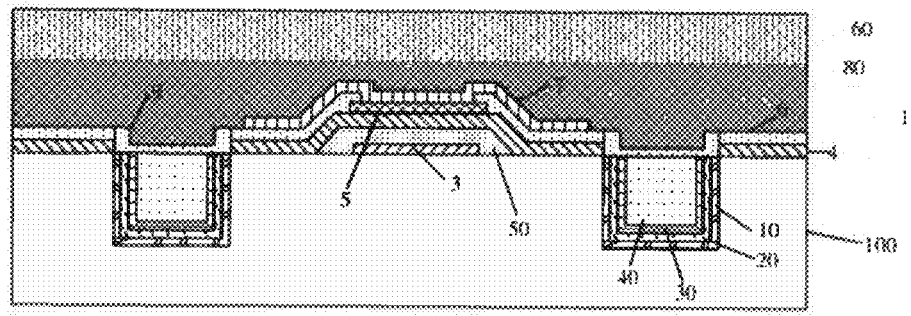

Afterwards, as shown in FIG. 14, the first substrate 100 forming the microbridge structure is bonded with a temporary bonding wafer 60. For example, the bonding is realized by bonding adhesive 80. The temporary wafer 60 is equivalent to a protective film and can protect the microbridge structure in the subsequent process flow. It should be understood that in addition to the temporary bonding wafer 60, other protective structures well-known to those skilled in the art may be adopted to realize protection of the microbridge structure in the subsequent process flow.

Figure 15:
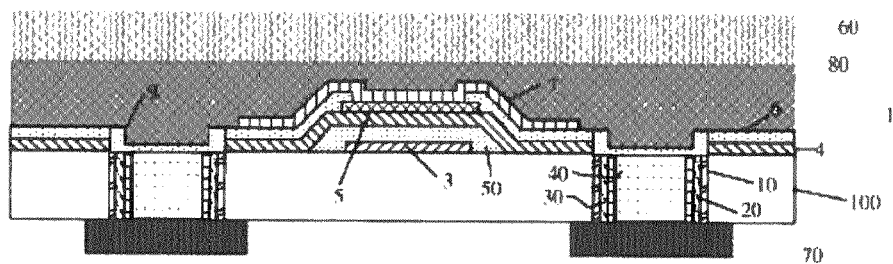

Afterwards, as shown in FIG. 15, the back of the first substrate 100 with the microbridge structure is thinned in order to expose the hole formed as shown in FIG. 4-FIG. 7. Then, the exposed hole is metalized to prepare a metal micro bump, micro pillar or pad structure 70 used for bonding in the subsequent process flow.

Figure 16:
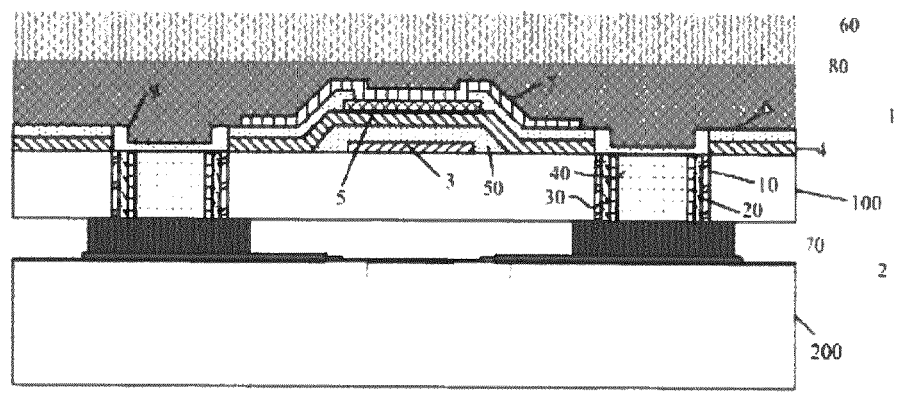

Afterwards, as shown in FIG. 16, a readout circuit 2 of the bolometer is prepared on a second substrate 200, and the first substrate 100 of the thermal radiation measurement element 1 with the microbridge structure and the second substrate 200 with the readout circuit 2 are bonded by flip chip bonding process to realize electrical connection between the thermal radiation measurement element 1 and the readout circuit 2. The readout circuit 2 of the bolometer according to the present invention may be prepared by employing a standard CMOS process.

Figure 17:
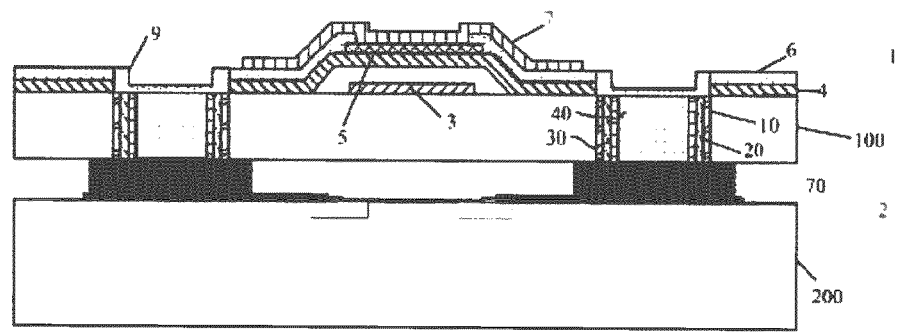
-FIG. 17 is a process flow chart for preparation of a microbridge non-refrigerating bolometer provided according to the present invention.

Afterwards, as shown in FIG. 17, the temporary bonding wafer 60 and the bonding adhesive 80 are removed and the sacrificial layer 50 is etched to obtain the final bolometer.

Those skilled in the art should understand that FIG. 4-FIG. 17 only take the bolometer with the microbridge structure as an example to describe the preparation flow of the bolometer provided by the present invention, but they don't intend to bring a limitation to the present invention. Without departing from the spirit and scope of the present invention, various modifications and variations may be made. For example, the temporary bonding wafer 60 and the bonding adhesive 80 may be removed at first and then the first substrate 100 of the thermal radiation measurement element 1 with the microbridge structure is bonded with the second substrate 200 with the readout circuit 2; alternatively, the thermal radiation measurement element 1 may be prepared at first and then the silicon via is prepared, and so forth. Further, the structure of the thermal radiation measurement element in the bolometer according to the present invention is not limited to the microbridge structure described herein and may be a micro-cantilever structure. As micro-cantilever structure is well-known to those skilled in the art, it is not described herein in detail.

What is claimed is:

1. A bolometer, comprising:
   a thermal radiation measurement element and a readout circuit, wherein the thermal radiation measurement element is formed on one side of a first substrate, an edge of the thermal radiation measurement element is provided with an electrode hole, the readout circuit is formed on one side of a second substrate and has an electrode, the first substrate is formed thereon with a silicon via passing through the first substrate and filled with a conductive material, and the electrode hole of the thermal radiation measurement element is electrically connected to the electrode of the readout circuit via the conductive material filled in the silicon via by using a metallic micro convex point, micro-column or pad structure, wherein the infrared detection element comprises a protective layer on an interconnecting layer on a thermosensitive element layer on a first portion of a supporting layer over a reflecting layer; wherein a cavity is formed between the reflecting layer and the first portion of the supporting layer; and wherein the interconnecting layer is connected to the electrode hole formed in a second portion of the supporting layer.

2. The bolometer according to claim 1, wherein the thermal radiation measurement element is an element with a microbridge structure.

3. The bolometer according to claim 1, wherein the conductive material is one or more selected from a group of copper, tungsten, polycrystalline silicon, conductive polymer and metal-polymer composite material.

4. The bolometer according to claim 1, wherein the diameter of the silicon via is in the range of 1~20 μm and the depth of the silicon via is in the range of 20~200 μm.

5. A method for preparation of a bolometer, comprising:
   etching one side of a first substrate to form a first hole and filling the first hole with a conductive material;
   preparing an thermal radiation measurement element on the side of the first substrate on which the first hole is formed, wherein the thermal radiation measurement element has an electrode hole electrically contacting the first hole, wherein the infrared detection element comprises a protective layer on an interconnecting layer on a thermosensitive element layer on a first portion of a supporting layer over a reflecting layer; wherein a cavity is formed between the reflecting layer and the first portion of the supporting layer; and wherein the interconnecting layer is connected to the electrode hole formed in a second portion of the supporting layer;
   thinning the other side of the first substrate without the prepared thermal radiation measurement element until the first hole is exposed in order to form a silicon via;
   metalizing the other side of the first substrate without the prepared thermal radiation measurement element to prepare a metal micro convex point, micro-column or pad structure used for bonding;
   preparing a readout circuit on a second substrate, wherein the readout circuit has an electrode; and
   bonding the metalized side of the first substrate and the side of the second substrate with the prepared readout circuit, thereby realizing electrical connection between the electrode hole of the thermal radiation measurement element and the electrode of the readout circuit via the conductive material filled in the silicon via.

6. The method according to claim 5, wherein the method further comprises:
   forming a protective film on the side of the first substrate with the prepared thermal radiation measurement element prior to thinning the first substrate; and
   removing the protective film after the metalized side of the first substrate and the side of the second substrate with the prepared readout circuit are bonded.

7. The method according to claim 5, wherein the etching one side of the first substrate to form the first hole and filling the first hole with the conductive material includes:
  etching one side of the first substrate to form the first hole;
  forming an insulating layer on the bottom and side wall of the first hole;
forming a diffusion barrier layer on the bottom and side wall of the first hole where the insulating layer is formed;
  forming a seed layer on the bottom and side wall of the first hole where the diffusion barrier layer is formed; and
  filling a conductive material into the first hole where the seed layer is formed.

8. The method according to claim 5, wherein the diameter of the silicon via is in the range of 1~20 μm and the depth of the silicon via is in the range of 20~200μm.

9. The method according to claim 5, wherein the conductive material is one or more selected from a group of copper, tungsten, polycrystalline silicon, conductive polymer and metal-polymer composite material.

10. The method according to claim 6, wherein the protective film is formed on the side of the first substrate with the prepared thermal radiation measurement element includes: bonding a protective silicon wafer on the side of the first substrate with the prepared thermal radiation measurement element.

* * * * *